(12) United States Patent
Yamana et al.

(10) Patent No.: US 8,569,750 B2
(45) Date of Patent: Oct. 29, 2013

(54) ORGANIC ELECTROLUMINESCENCE ELEMENT

(75) Inventors: Masahito Yamana, Takarazuka (JP); Masahiro Nakamura, Osaka (JP)

(73) Assignee: Panasonic Corporation, Kadoma-shi (JP)

( * ) Notice: Subject to any disclaimer, the term of this patent is extended or adjusted under 35 U.S.C. 154(b) by 317 days.

(21) Appl. No.: 13/140,593

(22) PCT Filed: Dec. 18, 2009

(86) PCT No.: PCT/JP2009/071110
§ 371 (c)(1),
(2), (4) Date: Jun. 17, 2011

(87) PCT Pub. No.: WO2010/071195
PCT Pub. Date: Jun. 24, 2010

(65) Prior Publication Data
US 2011/0248253 A1  Oct. 13, 2011

(30) Foreign Application Priority Data
Dec. 19, 2008 (JP) .................. 2008-324555

(51) Int. Cl.
*H01L 35/24* (2006.01)
(52) U.S. Cl.
USPC ......... 257/40; 257/79; 257/E51.018; 313/504
(58) Field of Classification Search
CPC .............. H01L 51/5262; H01L 51/5268
USPC ............................ 257/40, E51.019
See application file for complete search history.

(56) References Cited

U.S. PATENT DOCUMENTS

| 6,505,901 B1 | 1/2003 | Fukuda |
| 2003/0189401 A1 | 10/2003 | Kido et al. |

(Continued)

FOREIGN PATENT DOCUMENTS

| EP | 1478025 A2 | 11/2004 |
| JP | 2000-243573 A | 9/2000 |

(Continued)

OTHER PUBLICATIONS

Supplementary European Search Report dated Jan. 28, 2013, issued for the counterpart European patent application No. 09833497.2.

(Continued)

*Primary Examiner* — Eva Yan Montalvo
(74) *Attorney, Agent, or Firm* — Edwards Wildman Palmer LLP

(57) ABSTRACT

The electroluminescence element comprises the light-reflective-electrode separated from the luminous point by distance "d" satisfying the following formula.

$$nd = a \times \frac{\lambda}{4}\left\{2m + \frac{\phi}{\pi}\right\} \text{ wherein } \phi = \tan^{-1}\left\{\frac{2(n_1 k_2 - n_2 k_1)}{n_1^2 - n_2^2 + k_1^2 - k_2^2}\right\}$$

λ is a wavelength of the light from the light emission layer. N is a refractive index of a certain layer between the luminous point and the light-reflective-electrode at λ. n1 and k1 is a refractive index and the extinction coefficient of the certain layer at λ. n2 and k2 is a refractive index and the extinction coefficient of the light-reflective-electrode at λ. m is 0 or 1. When "m" is 0, "a" satisfies the following formula.

$-1.17 \times n_{org}/n_{EML} + 1.94 \leq a \leq -0.16 \times n_{org}/n_{EML} + 2.33$ When "m" is 1, "a" satisfies the following formula.

$0.28 \times n_{org}/n_{EML} + 0.75 \leq a \leq 2.85 \times n_{org}/n_{EML} - 1.23$ norg is a refractive index of a predetermined layer in contact with the light emission layer to be located on the same side as the light-reflective-electrode at λ. nEML is a refractive index of the light emission layer at λ.

6 Claims, 7 Drawing Sheets

(56) References Cited

U.S. PATENT DOCUMENTS

| | | |
|---|---|---|
| 2004/0195962 A1 | 10/2004 | Nakamura et al. |
| 2005/0142379 A1 | 6/2005 | Juni et al. |
| 2006/0192471 A1 | 8/2006 | Inoue et al. |
| 2007/0029539 A1 | 2/2007 | Yashima et al. |
| 2007/0069641 A1 | 3/2007 | Hasegawa et al. |
| 2007/0182317 A1 | 8/2007 | Kido et al. |
| 2008/0258609 A1 | 10/2008 | Nakamura |
| 2009/0026921 A1 | 1/2009 | Kuma et al. |
| 2009/0115315 A1 | 5/2009 | Takaya et al. |

FOREIGN PATENT DOCUMENTS

| | | |
|---|---|---|
| JP | 2003-272860 A | 9/2003 |
| JP | 2004-165154 A | 6/2004 |
| JP | 2004-296423 A | 10/2004 |
| JP | 2004-296429 A | 10/2004 |
| JP | 2006-244713 A | 9/2006 |
| JP | 2006-253015 A | 9/2006 |
| JP | 2007-012370 A | 1/2007 |
| JP | 2007-043097 A | 2/2007 |
| JP | 2007-066883 A | 3/2007 |
| JP | 2007-123249 A | 5/2007 |
| JP | 2007-234253 A | 9/2007 |
| JP | 2008-135373 A | 6/2008 |

OTHER PUBLICATIONS

International Search Report dated Mar. 30, 2010, issued for PCT/JP2009/71110.

ORGANIC ELECTROLUMINESCENCE ELEMENT

TECHNICAL FIELD

This invention relates to organic electroluminescence elements which are used for a lighting source, a backlight for the liquid crystal display instrument, and a flat panel display. Specifically, this invention relates to the organic electroluminescence elements which are designed on the basis of the adequate optical design to have a good light emitting property when the light scattering region is provided on the outer surface of the light transmissive substrate, which is defined as a part of the organic electroluminescence element.

BACKGROUND ART

FIG. 6 shows one example of the structure of the organic electroluminescence element. The organic electroluminescence element comprises a light transmissive substrate 6, a light transmissive electrode 1 which is defined as an anode, a hole transport layer 8, a light emission layer 3, an electron transport layer 9, and a light reflective electrode 2 defined as a cathode. The light transmissive electrode 1, the hole transport layer 8, the light emission layer 3, the electron transport layer 9, a light reflective electrode 2 are provided on the upper surface of the light transmissive substrate 6 such that the light transmissive electrode 1, the hole transport layer 8, the light emission layer 3, the electron transport layer 9, a light reflective electrode 2 are arranged in order. In this organic electroluminescence element, when the voltage is applied between the electrode 1 and the electrode 2, the electron is injected into the light emission layer 3 through the electron transport layer 9. Similarly, when the voltage is applied between the electrode 1 and the electrode 2, the hole is injected into the light emission layer through the hole transport layer 8. When the electron is recombined with the hole in the light emission layer 3, the light emission is made in the light emission layer 3. The light emitted in the light emission layer 3 is sent to the outside through the light transmissive electrode 1 and the light transmissive substrate 6.

Such the organic electroluminescence element has a property of emitting the light by itself. In addition, the organic electroluminescence element has a light emission property of comparatively high efficiency. In addition, the organic electroluminescence element has a property of emitting the light having various colors. The organic electroluminescence element is expected to be used for the luminous body for the display device such as flat panel display, a light source such as a backlight of the liquid crystal display, and a lighting device. In addition, a part of the organic electroluminescence element is practically used.

However, the organic electroluminescence element is a thin film device having a thickness which is approximately same as an order of the optical wavelength. In addition, the organic electroluminescence element has the thickness which is correlated with the light emission property. Thus, there is a necessity for the device structure of the electroluminescence element to have the design of the film design which is suitable for both the electrical design and the optical design.

In general, when the organic electroluminescence element generates the light in the light emission layer 3 of the organic electroluminescence, the light is totally reflected by the light emission layer 3, the organic layer 4, inside of the electrode, and the inside of the substrate 6, whereby the light generated in the organic electroluminescence element is confined in the light emission layer 3, the organic layer 4, inside of the electrode, and the inside of the substrate 6. According to a simple estimation, when the light emission layer 3 generates the light, 50 percents of the light generated in the light emission layer 3 is confined in the inside of light emission layer 3, the inside of the organic layer 4, and the inside of the light transparent electrode 1. In addition, 30 percents of the light generated in the light emission layer 3 is confined in the inside of the substrate 6. Therefore, the an amount of the light which is emitted to the outside is only 20 percents of the total amount.

In addition, as shown in FIG. 7, it is well known for the substrate 6 that the light scattering region 7 is disposed on the outer surface of the substrate 6. The light scattering region 7 allows a part of the light confined in the substrate 6 to be extracted to the outside of the organic electroluminescence element. This configuration makes it possible to increase an amount of the light which is extracted to the outside of the organic electroluminescence element.

In addition, as shown in FIG. 1, it is well known to employ the light transmissive electrode 1 and the substrate 6 with a light scattering region 7 between the light transmissive electrode 1 and the substrate 6. In this case, a part of the light which is confined in the light emission layer 3, the organic layer 4, and the light transmissive electrode 1 is extracted from the organic electroluminescence element. As mentioned above, an amount of the light which is confined in the light emission layer 3, the organic layer 4, and the light transmissive electrode 1 is greater than an amount of the light which is confined in the substrate 6. Therefore, the organic electroluminescence element comprises the light transmissive electrode 1 and the substrate 6 with the light scattering region 7 between the light transmissive electrode 1 and the substrate 6 is configured to emit the light having an amount which is greater than an amount of the light which is emitted from the organic electroluminescence element comprising the substrate 6 with the light scattering region 7 on the outer surface of the substrate 6.

In addition, in such the organic electroluminescence element, there are some reports of the organic electroluminescence element having a designing of the distance between the luminous point in the light emission layer 3 and the light transmissive electrode 2 in order to increase an amount of the light which is given off to the outside of the organic electroluminescence element. For example, the organic electroluminescence element disclosed in the patent literature 1 has a luminous point and the light transmissive electrode 1 to create a distance between the luminous point and the light transmissive electrode 1; the distance between the luminous point and the light transmissive electrode 1 is approximately equal to an even multiple of the one-quarter of the wavelength. In addition, the organic electroluminescence element has the luminous point and the light reflective electrode 2 to create a distance which is approximately equal to an odd multiple of one-quarter of the wavelength. The patent literature 2 discloses the electroluminescence element comprising the electrodes which are arranged to create the distance between the electrodes; the distance is determined on the basis of the phase shift of the light. The patent literature 3 disclose the organic electroluminescence element comprising the light transmissive electrode 1 and the light reflective electrode 2 which are arranged to create the distance between the light transmissive electrode 1 and the light reflective electrode; the distance is set within a predetermined range which is determined on the basis of the phase shift of the light in the light reflective electrode 2. In addition, each one of the patent literature 4 and the patent literature 5 discloses the organic electroluminescence element which comprises the substrate 6 with the light scattering region 7, and the electrodes which are arranged to create the distance between the electrodes; the distance between the electrodes are determined to have a predetermined value.

Each one of the patent literatures discloses that the organic electroluminescence element has the luminescence efficiency which is greatly related to the thickness of the light transparent film which constitutes the organic electroluminescence element. In addition, each the patent literature discloses to employ the luminous point and the light reflective electrode 2 with "the film having a particular optical thickness" between the luminous point and the light reflective electrode 2 in order to obtain the good efficiency under a condition where the particular optical thickness satisfies the following exemplified formula. "The particular optical thickness is equal to (2m+1)/4 multiple of the luminous wavelength (m is an integer number and is more than zero).

However, the patent literature 1 fails to disclose the consideration of the phase shift of the light in the light reflective electrode 2. In addition, the patent literature 2 discloses the target spectrum; the half width of the spectrum is limited to be equal to or less than 50 nanometers. The patent literature 3 only defines the distance between the electrodes. In contrast, the patent literature 3 discloses no definition of the distance between the luminous point and the light reflective electrode 2. Furthermore, each one of the patent literatures 1 to 3 discloses the optical designing of the organic electroluminescence element which employs the substrate and other members without light scattering region 7 on the substrate and other members.

In contrast, each one of the patent literatures 4 and 5 discloses the organic electroluminescence element which comprises the light scattering region 7. However, each one of the patent literatures 4 and 5 only disclose only the definition of satisfying the above formula under a condition where the "m" is equal to zero. Therefore, it is impossible to apply the technical feature of the above to the situation where there is a necessity to arrange the light emission layer 3 and the light reflective electrode 2 to create the distance of a certain level between the light emission layer 3 and the light reflective electrode 2. This is similar to the patent literature 2.

In view of this, the applicant of this application discloses the appropriate distance between the luminous point and the light reflective electrode 2 in a case where the light scattering region 7 is disposed on the outer surface of the substrate 6 shown in FIG. 7 and where there is a need to create the distance between the light emission layer 3 and the light reflective electrode 2, with respect to arbitral luminescence spectrum.

However, as will be understood from the previous explanation, the organic electroluminescence element comprising the light scattering region 7 between the light transmissive electrode 3 and the substrate 6 emits the light which has an amount which is greater than an amount of the organic electroluminescence element comprising a light scattering region 7 on the outer surface of the substrate 6. With regard to the organic electroluminescence element having this configuration, a design principle of the suitable distance between the luminous point and the light reflective electrode 2 under a situation where a certain distance is needed between the light emission layer 3 and the light reflective electrode 2 with respect to the arbitral emission spectrum is not cleared.

In addition, recently, an organic electroluminescence element of new type shown in FIG. 2 is disclosed. This organic electroluminescence element comprises a plurality of the light emission layers 3 and a charge supply layer 10 which is disposed between the light emission layers 3; the charge supply layer 10 comprises a light transmissive electrode, and a charge generation layer which comprises layers such as a an organic semiconductor, an inorganic semiconductor, an electron accepting material, and an electron releasing material. A plurality of the light emission layer 3 are stacked along a thickness direction of the organic electroluminescence element. The organic electroluminescence element of the above type has a possibility of emitting the light having a high brightness, and of long operating life, whereby the organic electroluminescence element of the above type is highly expected its future progress. However, the principle of the optical design for the future progress is not clear yet. Furthermore, there is no report of the configuration of providing "a region for reflecting the light and disturbing the angle of the light 7" between the light transmissive electrode 1 and the substrate 6.

Patent Literature 1

Japanese patent application publication No. 2000-243573

Patent Literature 2

Japanese patent application publication No. 2004-165154

Patent Literature 3

Japanese patent application publication No. 2006-253015

Patent Literature 4

Japanese patent application publication No. 2004-296423

Patent Literature 5

Japanese patent application publication No. 2004-296429

DISCLOSURE OF THE INVENTION

Problem to be Solved by the Invention

This invention is achieved in view of the above matter. An object in this invention is to produce an organic electroluminescence element having a good light emitting property. The organic electroluminescence element is produced on the basis of the adequate optical designing, whereby the organic electroluminescence element comprises a light transmissive electrode, a light transmissive substrate, and a light scattering region which is located in a position between the light transmissive electrode and the light transmissive substrate; the position of the light scattering region is determined on the basis of the adequate optical designing.

Means of Solving the Problem

In order to solve the above problem, the organic electroluminescence element in this invention comprises a light transmissive electrode, a light reflective electrode, an organic light emission layer, a light scattering layer, and a light transmissive substrate. The organic light emission layer comprises a light emission layer which comprises a luminescent material. The organic light emission layer has a first surface and a second surface which is opposite of the first surface from the organic light emission layer. The light reflective electrode is disposed on the first surface. The light transmissive electrode is disposed on the second surface. The light scattering layer is disposed on the light transmissive electrode. The light transmissive substrate is disposed on the light scattering layer. The light reflective electrode is separated from the luminous point of the light emission layer by "d". The "d" satisfies the following formula.

Formula (1)

$$nd = a \times \frac{\lambda}{4}\left\{2m + \frac{\phi}{\pi}\right\} \quad (1)$$

$$ただし \quad \phi = \tan^{-1}\left\{\frac{2(n_1 k_2 - n_2 k_1)}{n_1^2 - n_2^2 + k_1^2 - k_2^2}\right\}$$

"λ" is defined by a wavelength of a predetermined light which is emitted from the light emission layer. "n" is a refractive index of a layer which is located between the luminous point and the light reflective electrode at the light having the wavelength "λ". "n1" is a refractive index of a layer which is located between the luminous point of the light emission layer and the light reflective electrode and which is in contact with the light reflective electrode, at the light having the wavelength "λ". "k1" is an extinction coefficient of the layer which is located between the luminous point of the light emission layer and the light reflective electrode and which is in contact with the light reflective electrode, at the light having the wavelength "λ". "n2" is a refractive index of the light reflective electrode at the wavelength "λ" of the light. "k2" is an extinction coefficient of the light reflective electrode at the light having the wavelength "λ". "m" is equal to 0 or 1. When "m" is equal to 0, "a" satisfies a following formula.

$$-1.17 \times n_{org}/n_{EML} + 1.94 \leq a \leq -0.16 \times n_{org}/n_{EML} + 2.33$$

When "m" is equal to 1, "a" satisfies a following formula $$0.28 \times n_{org}/n_{EML} + 0.75 \leq a \leq 2.85 \times n_{org}/n_{EML} - 1.23$$

"$n_{org}$" is a refractive index of a layer which is in contact with the light emission layer and which is located on a same side of the light emission layer as the light reflective electrode at the light having the wavelength "λ", "$n_{EML}$" is a refractive index of the light emission layer at the light having the wavelength "λ".

It is preferred that the wavelength λ of a predetermined light satisfies a condition where a product being obtained by multiplying a spectral radiant flux of the photoluminescence spectrum of the predetermined light and the CIE standard luminosity factor has maximum.

In this case, it is possible to increase the light flux which is emitted from the organic electroluminescence element.

It is preferred that the wavelength λ satisfies a condition where a quotient which is obtained by dividing the spectral radiant flux of the photoluminescence spectrum of a predetermined light by a photon energy of each the energy has a maximum.

In this case, it is possible to increase the photon number which is emitted from the organic electroluminescence element.

It is preferred that the organic light emission layer has two light emission layers. In this case, the distance between the luminous point of each the light emission layer and the first electrode is defined by "d".

In this case, it is possible to especially increase the light flux or the photon number which are emitted from the organic electroluminescence element.

BEST MODE FOR CARRYING OUT THE INVENTION

Hereinafter, explanation of the best mode for carrying out the invention is made.

Figure 1:
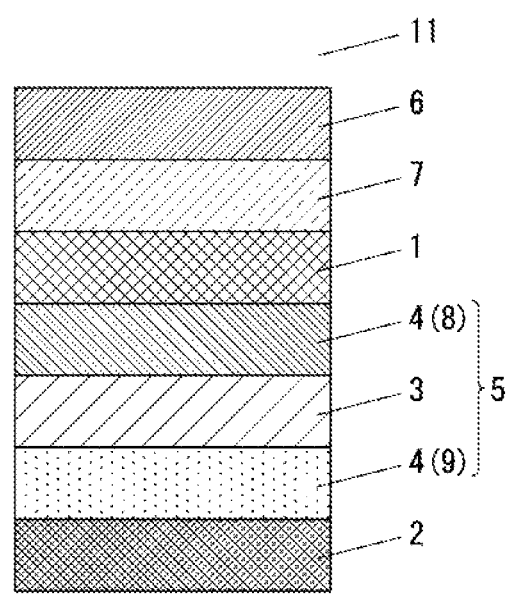
FIG. 1 shows a schematic cross sectional view of one example of the organic electroluminescence element.

FIG. 1 shows one example of a configuration of the organic electroluminescence element. The organic electroluminescence element comprises a light transmissive substrate 6, a light scattering layer 7, a light transmissive electrode 1, an organic light emission layer 5, and a light reflective electrode 2. The light scattering layer 7 is disposed on the light transmissive substrate 6. The light transmissive electrode 1 is disposed on the light scattering layer 7. The organic light emission layer 5 is disposed on the light transmissive electrode 1. The light reflective electrode 2 is disposed on the organic light emission layer 5. Therefore, the light reflective electrode 2 is disposed on the lower surface of the organic light emission layer 5. (The light reflective electrode 2 is disposed on the first surface of the organic light emission layer 5.) The light transmissive electrode 1 is disposed on the upper surface of the organic light emission layer 5. (The light transmissive electrode 1 id disposed on the second surface of the organic light emission layer 5.) In addition, the light scattering layer 7, the light transmissive electrode 1, the organic light emission layer 5, and the light reflective electrode 2 are stacked on the light transmissive substrate 6 such that the light scattering layer 7, the light transmissive electrode 1, the organic light emission layer 5, and the light reflective electrode 2 are arranged in order. The organic light emission layer 5 comprises a light emission layer 3 which is made of luminescence material. Further, in addition to the light emission layer 3, the organic light emission layer comprises an organic layer 4 arbitrarily; the organic layer 4 is exemplified by a charge injection layer, the charge transport layer 9, the hole blocking layer, the hole injection layer, the hole transport layer 8 which are stacked. In the example shown in the illustration, the charge transport layer 9 is interposed between the light reflective electrode 2 and the light emission layer 3. The hole transport layer 8 is interposed between the light transmissive electrode and the light emission layer 3. It is noted that a plurality of the light emission layer 3 on the light emission layer may be employed as the light emission layer which is explained in the above. In addition, when the organic light emission layer 5 receives the voltage, the light emission layer emits the light.

The light reflective electrode 2 is configured to reflect the light which is emitted from the organic light emission layer 5. In contrast, the light transmissive electrode 1 is configured to transmit the light which is emitted from the light emission layer 5. In addition, the light transmissive electrode 1 is configured to transmit the light which is firstly emitted from the organic light emission layer 5 and is then reflected by the light reflective electrode 2. The light which is transmitted through the light transmissive electrode 1 is scattered by the light scattering layer 7. The light transmissive substrate 6 is configured to transmit the light which is scattered by the light scattering layer 7. In this manner, the organic electroluminescence element emits the light.

Figure 2:
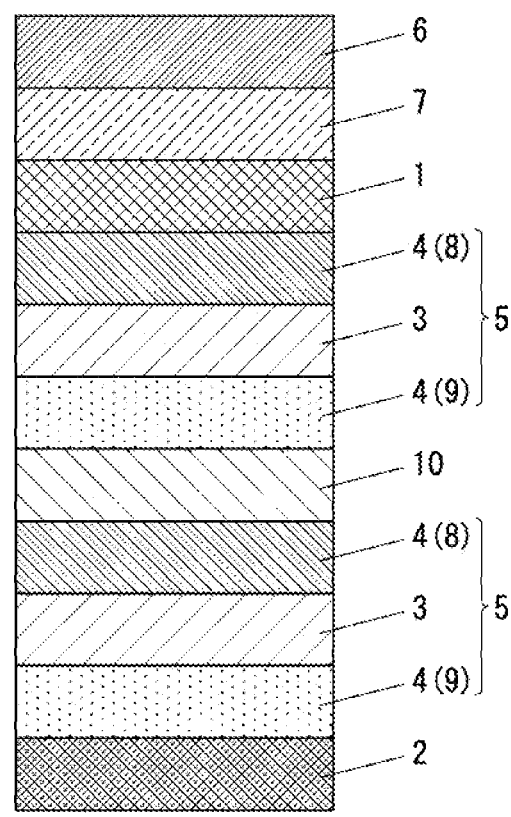
FIG. 2 shows a schematic cross sectional view of another example of the organic electroluminescence element.

In addition, FIG. 2 shows one example of the electroluminescence element which comprises two light emission layer 3. In the illustrated example, the light scattering layer 7 is disposed on the light transmissive substrate 6. The light transmissive electrode 1 is disposed on the light scattering layer 7. A first organic light emission layer 5 is disposed on the light transmissive electrode 1. The charge supply layer 10 is disposed on the first organic light emission layer. A second organic light emission layer 5 is disposed on the charge supply layer 10. The light reflective electrode 2 is disposed on the second organic light emission layer 5. Therefore, the light scattering layer 7, the light transmissive electrode 1, the first organic light emission layer 5, the charge supplying layer 10, the second organic light emission layer 5, and the light reflective electrode 2 are stacked on the light transmissive substrate 6 such that the light scattering layer 7, the light transmissive electrode 1, the first organic light emission layer 5, the charge supply layer 10, the second organic light emission layer 5, and the light reflective electrode 2 are arranged in series. Similar to the above explanation, each one of the organic light emission layer 5 comprises the light emission layer 3 which includes the luminescence material. Further, in addition to the light emission layer 3, each one of the organic light emission layer 5 comprises the organic layer 4, arbitrarily; the organic layer 4 comprises the charge injection layer, the charge transport layer 9, the hole blocking layer, the hole injection layer, and the hole transport layer 8. Therefore, the organic electroluminescence element shown in FIG. 2 may be considered to have one organic light emission layer comprising a plurality of the light emission layers. In the illustrated example, the light reflective electrode 2 is located on a same side of the organic light emission layer 5 as the charge transport layer 9. The hole transport layer 8 is disposed on the same side of the organic light emission layer 5 as the light transmissive electrode 1.

In addition, the organic electroluminescence element may comprises a plurality of the light emission layers 3. In this case, a plurality of the charge supply layer 10 is interposed between the light transmissive electrode 1 and the light reflective electrode 2. In addition, the organic light emission layer 5 is interposed between the light transmissive electrode 1 and the charge supply layer 10. In addition, the organic light emission layer is interposed between the charge supply layer 10 and the light reflective electrode 2. The organic electroluminescence elements are constituted according to the above. In addition, it is possible to stack a plurality of the light emission layers in the organic light emission layer 5. When a plurality of the light emission layers 3 are employed, the number of the stacked layer is not limited. However, increase of the number of the light emission layer 3 causes the increase of the difficulty of the optical designing and the electrical designing of the organic electroluminescence element. Therefore, it is preferred that the number of the light emission layers 3 is equal to or less than five. In addition, it is more preferred that the number of the light emission layers is equal to or less than three.

In the organic electroluminescence element, the light scattering layer 7 is only required to have a property of effectively varying the light transmission angle more than totally reflecting angle into the light transmission angle less than totally reflecting angle. The light scattering layer 7 having the above property makes it possible for the organic electroluminescence element to emit the light which travels inside the organic electroluminescence element is emitted to the outside of the organic electroluminescence element. Such the light scattering layer 7 is realized by the layer which is provided at its surface with irregularity. In addition, the light scattering layer 7 comprises a layer having a boundary which has a light reflective property. In addition, the light scattering layer 7 may be realized by a layer which comprises medium which are different in the refractive index from each other and which are in contact with each other to make boundaries. "The layer comprising particles or voids" and "the layer made of a plurality of the materials which are mixed with each other" act as the light scattering layer 7. The light scattering layer is disposed on the substrate 6. In addition, it is possible to employ the substrate which is provided at its surface with the irregularity. In this case, the surface with irregularity of the substrate is defined as the light scattering layer 7. Furthermore, it is possible to employ arbitral configuration as the light scattering layer 7 unless the arbitral configurations are against the spirit of the invention. For example, it is possible to form the light scattering layer 7 by a scattering particle layer which is realized by the transparent material with the particles or voids; the transparent material is exemplified by the polyester series resin, the epoxy resin, the polyurethane series resin, the silicone series resin, and the acrylic series resin; the particles are exemplified by silica particles, titania particles, zirconia particles, plastic particles, and the liquid crystal particles which respectively have refractive index which is different from the refractive index of the transparent material. In addition, it is possible to form the planarizing layer on the scattering particle layer. In this case, the planarizing layer is made of transparent resin. The scattering particle layer is cooperative with the planarizing layer to constitute the light scattering layer 7. The transparent resin for forming the planarizing layer may include fine particles which has sizes smaller than the sized of the particles in the scattering layer, if needed. The planarizing layer is provided for flatting the light scattering layer 7 in order to flatting the light transmissive electrode under a condition where the light transmissive electrode 1 is stacked on the light scattering layer 7. It is preferred to employ the planarizing layer which is made of material having the refractive index which is approximately equal to the refractive index of the light transmissive electrode 1. "Approximately equal" means the refractive index with a margin of plus or minus 0.1.

It is preferred that the light scattering layer 7 has a light transmission rate which is equal to or more than 50 percents. It is more preferred that the light scattering layer 7 has a light transmission rate which is equal to or more than 80 percents. It is noted that a variation of the directionality of the light of the light scattering layer 7 is not limited, especially. However, it is preferred to employ the light scattering layer 7 which has a designing of not totally reflecting the light but transmitting the light.

In addition, the conventional members such as the anode, cathode, the light emission layer 3, the charge transport layer 9, the charge supply layer 10 may be employed as a components which constitute the organic electroluminescence element without any modification.

The light transmissive substrate 6 may be realized by the transparent glass plate made of material such as soda lime glass and alkali-free glass. The light transmissive substrate 6 also may be realized by the plastic film and the plastic plate which are made of resin such as polyester, polyolefin, polyamide, epoxy, and fluorine series and which are manufactured by the arbitrary process.

The anode is an electrode which is provided for injecting the hole into the light emission layer 3. It is preferred for the anode electrode to be made of the electrode material such as metal, alloy, electrical conductive compound, and a mixture of the metal, alloy, and electrical conductive compound, which has a large work function. It is preferred for the anode to be made of the electrode material having the work function of more than 4 eV. The material of the anode satisfying the above requirement is exemplified by CuI, ITO (indium tin oxide), $SnO_2$, ZnO, IZO (indium zinc oxide), PEDOT, electro conductive polymer such as polyaniline electro conductive polymer with arbitral acceptor as a dopant, and electrical conductive-transparent material such as carbon nanotube. The anode is realized by the light scattering layer 7 and a thin film on the surface of the light scattering layer 7; the thin film is formed by vacuum deposition, sputtering, and application.

In addition, if the anode is realized by the light transmissive electrode 1, it is preferred to employ the light transmissive electrode 1 having the light transmission rate of equal to or more than 70%.

In addition, it is preferred that the anode has a sheet resistance which is equal to or less than several hundreds ohm per square. It is more preferred that the anode has the sheet resistance which is equal to or less than one hundred ohm per square. The anode is varied its film thickness according to the material for controlling the property of the light transmission rate of the anode and the sheet resistance. However, the anode has the film thickness of equal or less than 500 nm. In addition, the anode has the film thickness of equal to or less than 10 nm and equal to or less than 200 nm.

The cathode is an electrode for injecting the electron into the light emission layer 3. It is preferred for the cathode to be made of the electrode material such as metal, alloy, electrical conductive compound, and the mixture thereof which have low work function. It is more preferred that the cathode has the work function of equal to or less than 5 eV. The electrode material of the cathode is exemplified by alkali metal, alkali metal halide, alkali metal oxide, alkali earths metal, and the alloy thereof with the other metals; alloys are exemplified by sodium, sodium potassium alloy, lithium, magnesium, magnesium silver mixture, magnesium indium mixture, aluminum lithium alloy, and aluminum lithium fluorine mixture. In addition, aluminum, and aluminum-aluminum oxide mixture may be used as the electrode material of the cathode. Furthermore, it is also possible to employ the cathode which comprises the foundation layer and the metal layer prepared on the foundation layer; the foundation layer is made of material such as alkali metal oxide, alkali metal halide, metal oxide; the metal layer comprises more than one layer which is made of metal. Such the cathode is exemplified by the multilayer which is exemplified by alkali metal/aluminum, alkali metal halide/alkali earth metal/aluminum, alkali metal oxide/aluminum. As to the alternative means of the above, it is possible to realize the light reflective electrode 2 by the transparent electrode in combination with the light reflective layer. Furthermore, the cathode may be realized by the transparent electrode such as ITO and IZO. In this case, the cathode is prepared on the substrate 6. In this case, it is possible to dope alkali metal or alkali earth metal to the organic layer which is defined as a boundary of the cathode with respect to the substrate; the alkali metal and alkali earth metal are exemplified by lithium, sodium, cesium, and calcium.

In addition, the cathode is, for example, realized by the thin film which is formed by the vacuum deposition and a sputtering. If the cathode is realized by the light reflective electrode 2, it is preferred for the light reflective electrode 2 to have the light transmission rate which is equal to or less than 10 percents. If the cathode is realized by the light transmissive electrode 1, it is preferred for the cathode to have the light transmission rate which is equal to or more than 70 percents. In this case, the cathode is varied its thickness according to the material in order to control the property such as the light transmission rate of the cathode. However, it is possible for the cathode to have the film thickness which is equal to or less than 500 nm. In addition, it is preferred for the cathode to have the film thickness which is equal to or more than 100 nm and is equal to or less than 200 nm.

The charge transport layer 9 may be made of material of a group of having an electron transport property. Such the compound is exemplified by "a metallic complex" and "a compound having heterocycle"; the metallic complex is such as Alq3 which is known as the electron transport material; the compound having heterocycle is exemplified by phenanthroline derivatives, pyridine derivatives, tetrazine derivatives, and oxadiazole derivatives. However, the compound of the charge transport layer 9 is not limited thereto. The charge transport layer 9 may be determined its material by the charge transport material which is arbitrary determined and which is generally known. Especially, the charge transport layer 9 is preferably made of the material having a high charge transport property.

The hole transport layer 8 is made of material of compound having a hole transport property. The compound having the hole transport property is exemplified by tryarylamine compounds, amine compounds which contains carbazole unit, and amine compounds which contains fluorine derivatives. The tryarylamine compounds is exemplified by "4,4'-bis[N-(naphthyl)-N-phenyl-amino] biphenyl (α-NPD)", "N,N'-diphenyl-N,N'-bis(3-methylphenyl)-(1,1'-biphenyl)-4,4'-diamine (TPD)", "2-TNATA", "4,4',4"-Tris(N-3-methylphenyl-N-phenylamino)triphenylamine (MTDATA)", "4,4'-N,N'-dicarbazole-biphenyl", "Spiro-NPD", "Spiro-TPD", "Spiro-TAD", "TNB". However, the electron transport layer 9 may be made of any well known hole transport material.

In addition, the light emissive layer 3 is made of a well known appropriate material for organic electroluminescence device. The material of the light emissive layer 3 is exemplified by anthracene, naphthalene, pyrene, tetracene, coronene, perylene, phtaloperylene, naphthaloperylene, diphenylbutadiene, tetraphenylbutadiene, coumarine, oxadiazole, bisbenzoxazoline, bisstyryl, cyclopentadiene, quinoline metal complex, tris(8-hydroxyquinolinate)aluminum complex, tris(4-methyl-8-quinolinate)aluminum complex, tris(5-phenyl-8-quinolinate)aluminum complex, aminoquinoline metal complex, benzoquinoline metal complex, tri-(p-terphenyl-4-yl)amine, 1-aryl-2,5-di(2-thienyl)pyrrole derivatives, pyrane, quinacridone, rubrene, distyrylbenzene derivatives, distyrylarylenes derivatives, distyrylamine derivatives, fluorochromes, and these derivatives. However, the material of the light emissive layer 3 is not limited thereto. In addition, it is preferable to use the mixture of the above appropriate materials. Furthermore, the light emissive layer 3 may be made of materials which cause light emission from spin multiplicity in addition to the above mentioned materials which cause fluorescent emission. The material causing the light emission from the spin multiplicity is exemplified by compounds having phosphorescent properties, and compounds containing in one part of the compound having the phosphorescent property. In addition, the organic layer 4 is formed by a dry process of a deposition, a dry transfer printing, and wet process of spin coating, spray coating, die coating, and gravure printing.

The charge supply layer 10 is formed by a metal thin film, a metal oxide, a light transmissive electrical conductive film, a laminated film, and mixture thereof. The metal thin film made of a material is exemplified by Ag, Au, and Al. The metal oxide is exemplified by vanadium oxide, molybdenum oxide, rhenium oxide, and tungsten oxide. The light transmissive electrical conductive film is exemplified by ITO, IZO, AZO, GZO, ATO, and $SnO_2$. The laminated film is exemplified by films of n-type impurity semiconductor and a p-type impurity semiconductor. In addition, the laminated film is exemplified by films of at least one of an n-type impurity semiconductor and a p-type impurity semiconductor and at least one of a metal thin film and a light transmissive film. The mixture is exemplified by a mixture of n-type impurity semiconductor and the p-type impurity semiconductor, and a mixture of n-type impurity semiconductor and/or the p-type impurity semiconductor and the metal. Both the n-type impurity semiconductor and the p-type impurity semiconductor may be made of an organic material or an inorganic material. In addition, both the n-type impurity semiconductor and the p-type impurity semiconductor may be made of a mixture of the organic material and the metal, a mixture of the organic material and the metal oxide, a mixture of an organic material and an organic donor/accepter material, and a mixture of the organic material and an inorganic donor/accepter material. That is, the material of the charge supply layer 10 is not limited thereto, and is determined as necessary.

The organic electroluminescence element comprises the organic light emission layer 5 including the light emission layer 3 is interposed between the light transmissive electrode 1 and the light reflective electrode 2. The light scattering layer 7 is disposed on the light transmissive electrode 1. The light transmissive substrate 6 is disposed on the light scattering layer 7. The organic electroluminescence element has a designing for increasing the light flux or photon number.

First, an explanation of increasing the light flux emitted from the organic electroluminescence element is made. The organic electroluminescence element is designed such that the luminous point of at least one of the light emission layer 3 of the organic light emission layer 5 is separated from the light reflective electrode 2 by a distance "d" which satisfies the following formula (1). This configuration makes it possible to increase the light flux emitted from the organic electroluminescence element which comprises the light scattering layer 7.

It is noted that the luminous point is defined by a position where luminescence intensity of the light has maximum in the thickness direction of the light emission layer 3. It is difficult to determine the position of the luminous point by way of experiment, directly. However, it is possible to estimate the position of the luminous point by the optical calculation on the basis of the method of the film thickness dependence of the luminescence spectrum. Furthermore, it is also possible to determine the luminous point from the experience which is based on "the carrier mobility and the energy level" of the organic layer 3 such as the light emission layer 3, the hole transport layer 8, and the charge transport layer 9. In addition, there is a case that the light emission portions are distributed within the light emission layer 3 in the thickness direction. In this case, it is possible to consider the representative point having the maximum luminescence intensity as the luminous point.

Formula 2

$$nd = a \times \frac{\lambda_1}{4}\left\{2m + \frac{\phi}{\pi}\right\} \quad (1)$$

"$\lambda_1$" of formula (1) is a wavelength which satisfies a condition where a product obtained by multiplying "a spectral radiant flux of a photoluminescence spectrum of a predetermined light" and "a CIE relative luminosity factor" has a maximum value. That is, the formula (1) is provided for developing the condition of "increasing the light flux which is emitted from the organic electroluminescence element" on the basis of the wavelength which affects the light flux which is emitted from the organic electroluminescence element.

In addition, $\phi$ in the formula (1) is a phase shift of the light. The phase shift of the light is caused when the light is reflected by the region between a certain layer and the light reflective electrode 2; the certain layer is created by a layer between the luminous point and the light reflective electrode 2; the certain layer is in contact with the light reflective electrode. $\phi$ is represented by the following formula.

FORMULA (3)

$$\phi = \tan^{-1}\left\{\frac{2(n_1 k_2 - n_2 k_1)}{n_1^2 - n_2^2 + k_1^2 - k_2^2}\right\} \quad (3)$$

"$n_1$" is a refractive index of "the layer which is located between the luminous point and the light reflective electrode 2 and which is in contact with the light reflective electrode 2" with respect to the light having the wavelength "$\lambda_1$ (lambda$_1$)". "$k_1$" is an extinction coefficient "the layer which is located between the luminous point and the light reflective electrode 2 and which is in contact with the light reflective electrode 2" with regard to the light having the wavelength "$\lambda_1$ (lambda$_1$)". "$n_2$" is a refractive index of the light reflective electrode 2 with respect to the light having the wavelength "$\lambda_1$ (lambda$_1$)". "$k_2$" is an extinction coefficient of the light reflective electrode 2 with respect to the light having the wavelength "$\lambda_1$ (lambda$_1$)".

"n" in the formula (1) is a refractive index of "the film which is located between the luminous point and the light reflective electrode 2" with respect to the light having the wavelength "$\lambda_1$ (lambda$_1$)". "nd" is an optical distance from the luminous point to the light reflective electrode 2 with respect to the light having the wavelength "$\lambda_1$ (lambda$_1$)". In a case where there are a plurality of the films between the luminous point and the light reflective electrode 2, "nd" is calculated on the basis of the following formula by use of thickness of each the films and of the refractive index of the films.

$$nd = na \times da + nb \times db + \ldots$$

"na", "nb", ... mean the refractive indexes of the each one of the layers which are located between the luminous point and the light reflective electrode 2. "da", "db", ... mean the thicknesses of each one of the layers which is located between the luminous point and the light reflective electrode 2. The combination of a plurality of "da" and "db" are arbitrarily determined to satisfy the formula (1).

In addition, "m" in the formula (1) is equal to 0 or 1. "a" is a number which satisfies the following formula when "m" is equal to 0.

$$-1.17 \times n_{org}/n_{EML} + 1.94 \leq a \leq -0.16 \times n_{org}/n_{EML} + 2.33$$

"a" is a number which satisfies the following formula when "m" is equal to 1.

$$0.28 \times n_{org}/n_{EML} + 0.75 \leq a \leq 2.85 \times n_{org}/n_{EML} - 1.23$$

"$n_{org}$" is a refractive index of "the layer which is located on the same side of the light emission layer 3 as the light reflective electrode 2 and which is in contact with the light emission layer 3" with respect to the light having the wavelength "$\lambda_1$". "$n_{EML}$" is a refractive index of the light emission layer 3 with respect to the light having the wavelength "$\lambda_1$ (lambda$_1$)". "a" is determined its range for satisfying the condition where the value of the light flux has maximum or has near maximum by the analysis on the basis of the actual measured value.

The photoluminescence spectrum of the light emission layer 3 is measured according to the following method, for example. Firstly, a step of preparing thin film on the substrate 6 is performed; the thin film is made of material of host and dopant which are mixed at a mixture ratio which is equal to the mixture ratio of the host and the dopant of the light emission layer 3. Secondly, a step of applying the ultraviolet light to the thin film is performed. When the ultraviolet light is applied, the thin film emits the light. Thirdly, the light emitted from the thin film is measured by the integrating sphere. In this manner, the photoluminescence spectrum is measured.

In addition, the refractive index of the material which constitutes the organic electroluminescence element is measured by the device such as vertically incident type reflection and refraction meter. Furthermore, the extinction coefficient of the material which constitutes the organic electroluminescence element is measured by the device such as ellipsometer. In this case, it is possible to measure the wavelength dependency of the refractive index and the extinction coefficients in addition to the extinction coefficient.

The thickness of the organic electroluminescence element is adjusted to the value indicated by the formula (1) on the basis of the adjustment of film thickness and the refractive index of the layer such as "the light emission layer 3, the hole blocking layer, the charge transport layer 9, and the charge injection layer" between the light emission layer 3 and the light reflective electrode 2. In addition, the organic electroluminescence element may employ a plurality of the light emission layer 3 which is located in an inside of the charge supply layers 10. In this case, it is preferred to adjust the thickness of the layer other than the light emission layer 3 which is closest to the light reflective electrode in order to adjust the film thickness of the organic electroluminescence element; it is preferred to adjust the thicknesses or the refractive indexes of the hole transport layer 8 adjacent to the light emission layer 3 located near to the light reflective electrode 2 than another light emission layer 3, the hole transport layer 8, the hole injection layer, and the charge supply layer 10. When the above adjustment is made to adjust the thickness of the organic electroluminescence element to a predetermined thickness, there is a possibility that the electrical balance in the element is lost. However, the it is possible to adjust the electrical balance in the element by varying the ratio of the film thickness of the hole injection layer and the hole transport layer 8. Similarly, it is also possible to adjust the electrical balance in the element by varying the thickness ratio of charge transport layer 9 with respect to the charge injection layer. In addition, it is possible to adjust the electrical balance in the element by the arbitral means of varying the material which constitutes each one of the layers, and by means of adding the additive substance for adjusting the charge transport property to each one of the layers.

In addition, the organic electroluminescence element having an inverted structure from the above organic electroluminescence element is also known; the organic electroluminescence comprises "a light transmissive electrode 1 which acts as a cathode" and "a light reflective electrode 2 which acts as an anode". If the organic electroluminescence element has the inverted structure from the above organic electroluminescence element, the electroluminescence element comprises the light emission layer 3 and the light reflective electrode to have an intermediate layer therebetween; the intermediate layer is realized by the hole transport layer 8. Therefore, the organic electroluminescence element is adjusted its thickness by adjusting the thickness of the hole transport layer 8. However, it is possible to adjust the thickness of the organic electroluminescence element by the arbitrary layer, without any departure from the purpose of this invention.

In addition, if the organic electroluminescence element comprises the organic light emission layer 5 which comprises a plurality of the light emission layers, it is required to satisfy the above formula (1) by at least one of the light emission layers 3. Consequently, an amount of the light which is emitted from the organic electroluminescence element is increased.

In addition, if the organic electroluminescence element comprises two light emission layers, it is more preferred that each one of the two light emission layers satisfies the above formula (1). In this case, the light flux which is emitted from the organic electroluminescence element is especially increased. In addition, it is preferred to dispose "one of the light emission layers 3 which emits the light having the wavelength satisfying a predetermined condition" closer to the light reflective electrode 2 than the other of the light emission layer 3; the predetermined condition is a condition where the product obtained by multiplying the spectral radiant flux of the photoluminescence spectrum and the a CIE relative luminosity factor is maximum. In this case, it is possible to easily design the organic electroluminescence element to have the two light emission layers 3 each of which satisfies the formula (1).

Next, the explanation of the configuration of increasing the number of the photon which is emitted from the organic electroluminescence element is made. In the organic electroluminescence element, the organic light emission layer 5 and the light reflective electrode 2 are disposed such that the luminous point of the light emission layer 3 is separated from the light reflective electrode 2 by a distance "d" which satisfies a following formula (2). Consequently, it is possible to increase the number of the photon which is emitted from the organic electroluminescence element which comprises the light scattering layer 7.

Formula 2

$$nd = a \times \frac{\lambda_2}{4}\left\{2m + \frac{\phi}{\pi}\right\} \quad (2)$$

"$\lambda_2$ (lambda$_2$)" in the formula (2) is a wavelength which satisfies the condition where the quotient which is obtained by dividing spectral radiant flux of the photoluminescence spectrum of the light emitted from the light emission layer 3 by the photon energy becomes maximum value. That is, formula (2) is a formula for obtaining "the condition of increasing the photon number of the light emitted from the organic electroluminescence element" on the basis of the wavelength which has the largest effect on the photon number of the light which is emitted from the organic electroluminescence element.

In addition, φ in the formula (2) is a phase shift which is occurred by the reflection of the light in the area between the light reflective electrode 2 and a predetermined layer; the predetermined layer is located between the light reflective electrode 2 and the luminous point of the light emission layer 3; the predetermined layer is in contact with the light reflective electrode 2. The phase shift is shown in the following formula $$\phi = \tan^{-1}\left\{\frac{2(n_1 k_2 - n_2 k_1)}{n_1^2 - n_2^2 + k_1^2 - k_2^2}\right\}$$

"$n_1$" is a refractive index of a layer with respect to the wavelength "$\lambda_2$ (lambda$_2$)"; the layer is located between the light reflective electrode 2 and the luminous point of the light emission layer 3; the layer is in contact with the light reflective electrode 2. "$k_1$" is an extinction coefficient of the wavelength "$\lambda_2$" of the light in a layer; the layer is located between the light reflective electrode 2 and the luminous point of the light emission layer 3; the layer is in contact with the light reflective electrode 2. "$n_2$" is a refractive index of wavelength "$\lambda_2$" of the light with respect to the light reflective electrode 2. "$k_2$" is an extinction coefficient of the wavelength "$\lambda_2$" with respect to the light reflective electrode 2.

In addition, "n" in the formula (2) is a refractive index of the film which is located between the luminous point and the light reflective electrode 2, with respect to the wavelength "$\lambda_2$ (lambda$_2$)" of the light. "nd" is an optical distance between the light reflective electrode 2 and the luminous point with respect to the wavelength "$\lambda_2$ (lambda$_2$)" of the light. If there are a plurality of the films which are located between the luminous point and the light reflective electrode 2, it is possible to obtain the optical distance by the following formula, the thickness of each the layers, and the refractive index of each the layers.

$$nd = na \times da + na \times db + \ldots$$

Each one of "na", "na", ... means the refractive index of each one of the layers which are located between the luminous point and the light reflective electrode 2. Each one of "da", "db", ... means the thickness of each the layers which is located between the luminous point and the light reflective electrode 2. Combinations of "da", "db" is determined to satisfy the above formula (2).

In addition, the formula (2) includes "m" which is equal to "0" or "1". Furthermore, "a" is a value which satisfies the following formula when "m" is equal to "0".

$$-1.17 \times n_{org}/n_{EML} + 1.94 \leq a \leq -0.16 \times n_{org}/n_{EML} + 2.33$$

"a" is a value which satisfies the following formula when "m" is equal to "1".

$$0.28 \times n_{org}/n_{EML} + 0.75 \leq a \leq 2.85 \times n_{org}/n_{EML} - 1.23$$

"$n_{org}$" is a refractive index of a layer with respect to the wavelength "$\lambda_2$ (lambda$_2$)" of the light; the layer is located on the same side of the light emission layer 3 as the light reflective electrode 2; the layer is in contact with the light emission layer 3. "$n_{EML}$" is a refractive index of the light emission layer 3 with respect to the wavelength "$\lambda_2$ (lambda$_2$)" of the light. A range of "a" is developed from the analysis on the basis of the actual measurement value for satisfying the condition where the number of the photon becomes maximum or approximately maximum.

The photoluminescence spectrum of the light emission layer 3 may be measured by the following method, similar to the above method. First, the step of depositing a thin film on the substrate 6; the thin film is made of host and dopant at the same mixture ratio is performed. Second, the step of applying the ultraviolet light to the thin film is performed. Third, the step of measuring the light which is emitted from the thin film by the integrating sphere is performed. Consequently, the photoluminescence spectrum is measured.

In addition, the refractive index of the material which constitutes the organic electroluminescence element is measured by the device such as vertically incident type reflection and refraction meter. Furthermore, the extinction coefficient of the material which constitutes the organic electroluminescence element is measured by the device such as ellipsometer In this case, it is possible to measure the wavelength dependency of the refractive index and the extinction coefficients.

The organic electroluminescence element is determined its thickness to have the value which is represented by the formula (2) with regulating the thicknesses and the refractive indexes of "the light emission layer 3, the hole blocking layer, the charge transport layer 9, the charge injection layer", which are located between the light emission layer 3 and the light reflective electrode 2. In addition, the organic electroluminescence element which comprises a plurality of the light emission layers 3 which are inserted between the charge supply layers 10. In this case, it is possible to design the film thickness of the organic electroluminescence element by regulating the film thickness or the refractive index of a layer which is other than the light emission layer 3 which is closest to the light reflective electrode 2; the layer is, for example, the hole transport layer 8 which is adjacent to one of the light emission layer 3 which is located closer to the light reflective electrode 2 than the other of the light emission layer 3, the hole injection layer, and the charge supply layer 10; the layer. When the above adjustment is made to adjust the thickness of the organic electroluminescence element to a predetermined thickness, there is a possibility that the electrical balance in the element is lost. However, it is possible to adjust the electrical balance in the element by varying the ratio of the film thickness of the hole injection layer and the hole transport layer 8. Similarly, it is also possible to adjust the electrical balance in the element by varying the thickness ratio of charge transport layer 9 with respect to the charge injection layer. In addition, it is possible to adjust the electrical balance in the element by the arbitral means of varying the material which constitutes each one of the layers, and by means of adding the additive substance for adjusting the charge transport property to each one of the layers.

In addition, the organic electroluminescence element which has the inverted structure which comprises the light transmissive electrode 1 which acts as the cathode and the light reflective electrode 2 which acts as the anode is well known. In the organic electroluminescence element of the inverted structure, the light emission layer 3 and the light reflective electrode 2 are disposed to have the hole transport layer 8 therebetween. Therefore, thickness of the organic electroluminescence element is regulated according to the regulation of the film thickness of the hole transport layer 8. However, it is possible to adjust the thickness of the organic electroluminescence element by the arbitrary layer, without any departure from the purpose of this invention.

In addition, if the organic electroluminescence element comprises an organic light emission layer 5 which comprises a plurality of the light emission layers, it is required for at least one of the light emission layers 3 to satisfy the above formula (2). Consequently, an amount of the light which is emitted from the organic electroluminescence element is increased.

In addition, if the organic electroluminescence element comprises two light emission layers, it is preferred that each one of the two light emission layers 3 satisfies the above formula (2). Consequently, the photon number which is emitted from the organic electroluminescence element is especially increased. In addition, it is preferred to dispose one of the light emission layer which is closer to the light reflective electrode 2 than the other of the light emission layer; the one of the light emission layer is configured to emit the light having the wavelength which satisfies the condition where the quotient which is obtained by dividing the spectral radiant flux of the photoluminescence spectrum by the photon energy of each the wavelength. In this case, it is possible to easily design the organic electroluminescence element to have the two light emission layer 3 which satisfy the formula (2).

In the organic electroluminescence element which has a designing of increasing the light flux or the photon number of the light which is emitted from the organic electroluminescence element, not the brightness of the light which is emitted from the organic electroluminescence element to the front but the total amount of the light which is emitted from the organic electroluminescence element is increased. Therefore, such the organic electroluminescence element is suitably employed to the device which requires an amount of the light, especially the light source, the back light, and the lighting device which requires the amount of the light.

In addition, an amount of the light which is emitted from the light emission layer 3 to the light transmissive electrode 1 and also to the substrate 6 is increased (compared with the total amount of the light which is confined within the light transmissive electrode 1, the light which is confined within the substrate 6, and the light which is emitted to the outside through the substrate 6 in a case where no light scattering layer 7 is applied to the organic electroluminescence element). Therefore, it is possible to achieve the high light extracting efficiency by arranging the light scattering layer 7 and the light transmissive substrate 6 in this order such that the light scattering layer 7 and the light transmissive substrate 6 are opposite of the organic light emission layer 5.

In addition, the organic electroluminescence element is designed to increase the total amount of the light which enters the light transmissive electrode 1 and the substrate 6 from the light emission layer 3 of the organic electroluminescence element. Therefore, even if the organic electroluminescence element comprises the light scattering layer 7 and the light transmissive substrate 6 which are opposite of the organic light emission layer of the light transmissive electrode in this order, and further comprises another light scattering layer 7 on the outside of the light transmissive substrate 6, it is possible to realize the high light extracting efficiency. Similarly, even if the organic electroluminescence element comprises the light scattering layer 7 which is only disposed on the outside of the light transmissive substrate 6, it is also possible to realize the high light extracting efficiency.

In addition, in the above organic electroluminescence element, an amount of the light is increased while the light emission layer 3 and the light reflective electrode 2 are disposed such that the distance between the light emission layer 3 and the light reflective electrode 2 is kept so as not to be too short. Therefore, the designing of the above organic electroluminescence element is preferably employed, considering the electrical short due to the film thickness. In addition, within the effect of this invention, it is possible to increase the thickness of the hole transport layer which is disposed on the light transmissive electrode 1. In addition, it is possible to employ the hole injection layer of application type which is well known to have a property of high cover ratio with respect to the foreign matter.

According to the above, the organic electroluminescence element having the substrate 6 provided with the light scattering layer 7 makes it possible to realize the high light extracting efficiency, whereby it is possible to obtain the organic electroluminescence element having high efficiency.

EXAMPLE

Hereinafter, the examples are explained. However, this invention is not limited to the following examples.

Example 1

The light transmissive substrate 6 with the light scattering layer 7 was prepared according to the following steps. In a first, 86.8 g tetraethoxysilane was combined with 803.5 g isopropyl alcohol, and was further combined with 34.7 g gamma-methacryloxypropyl trimethoxysilane and 75 g 0.1-N nitric acid. Then, these were mixed with each other by the disper, whereby solution was obtained. The solution was agitated for 2 hours in the constant temperature reservoir of 40 degree Celsius. Consequently, 5 wt % solution of silicone resin having the weight-average molecular weight of 1050 was prepared as a binder formation material.

Then, the methyl silicone particles were added to the silicone resin solution. (The methyl silicone particles had mean diameter of 2 micrometer. The methylsilicone particles was Tospearl 120 (GE Toshiba Silicone).) The silicone resin solution has a ratio of the methyl silicone particles:the silicone resin is equal to 80:20 according to the solid content mass standard. (The ratio is determined on the basis of the conversion in condensation compound.) The methyl silicone particles were dispersed throughout the silicone resion solution by the homogenizer, whereby the methyl silicone particles dispersed silicone resin solution was prepared. It is noted that "the conversation in condensation compound" is a molarity of the silicone resin in a case where the hydrolytic condensation polymerization of the silicone resin is completed. When the silicone resin is a tetralkoxysilane, the molarity of the silicone resin is equal to the molarity that Si in tetralkoxysilane is calculated as $SiO_2$. When the silicone resin is a trialkoxysilane, the molarity of the silicone resin is equal to the molarity that Si in trialkoxysilane is calculated as $SiO_{1.5}$.

The alkali free glass having the thickness of 0.7 millimeters was used as the substrate 6. (The substrate is manufactured by Corning Co., Ltd. No. 1737). The methyl silicone particles dispersed silicone resin solution was applied to the surface of the substrate 6 by the spin coater under a condition where the substrate 6 was rotated by 1000 rpm. Then, the methyl silicone particles dispersed silicone resin solution was dried. The application and drying were performed six times. Then, the heat treatment of the film formed by the above step is performed at 200 degrees C. for 30 minutes. In this manner, the light scattering layer with the particles was prepared.

Then, the imide series resin is applied on the surface of the light scattering layer with the particles by the spin coater under a condition where the light scattering layer with the particles is rotated at 2000 rpm. (The imide series resin is HRI1783 which is manufactured by OPTMATE Co., Ltd. The imide series resin has a refractive index of 1.78, and concentration of 18 percent by mass.) Then the imide series resin was dried, whereby coated film was prepared. Subsequently, the heat treatment is applied to the coated film at 200 degree C. for 30 minutes. Consequently, the planarizing layer having the thickness of 4 μm was prepared. Consequently, the substrate 6 is provided at its surface with a region which comprises the light scattering layer with the particle and the planarizing layer.

Then, the ITO film having the thickness of 150 nm was prepared on the surface of the region 7 by the sputtering with using the target made of ITO (Indium Tin Oxide). (The target is manufactured by Tosoh Corporation.) The ITO film was annealed at 200 degree C. for 1 hour under Ar atmosphere. The annealed ITO film had the sheet resistance of 18 ohm/square.

Figure 3:
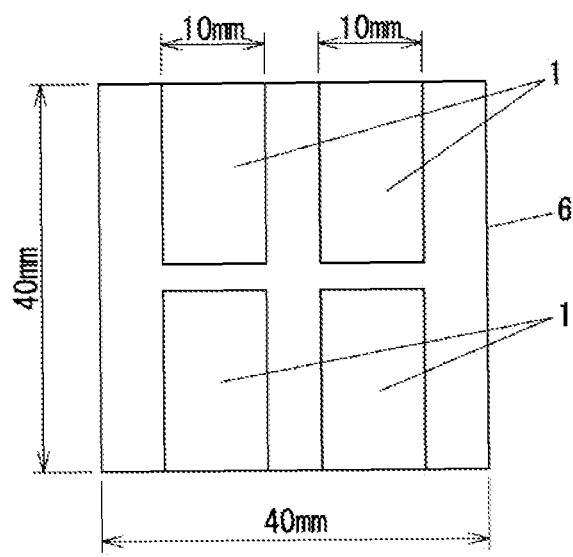
FIG. 3 shows a planar view of the glass substrate used in the example; the glass substrate is provided with ITO after the etching treatment.

Then, the etching is performed to the ITO film, whereby the remaining portion of the ITO having the size shown in FIG. 3 is prepared as the anode (which corresponds to the light transmissive electrode 1). Then the substrate was cut such that the substrate 6 was divided into regions each of which had the sizes shown in FIG. 3. Then, the ultrasonic cleaning with pure water for 10 minutes, with acetone for 10 minutes, and isopropyl alcohol for 10 minutes were performed to the laminated body which comprises the substrate 6, the region 7, and the electrode 1, in order. Subsequently, the laminated body was cleaned by isopropyl alcohol vapor for 2 minutes. After the laminated body was dried, the laminated body was further cleaned by UV ozone for 10 minutes.

Figure 4:
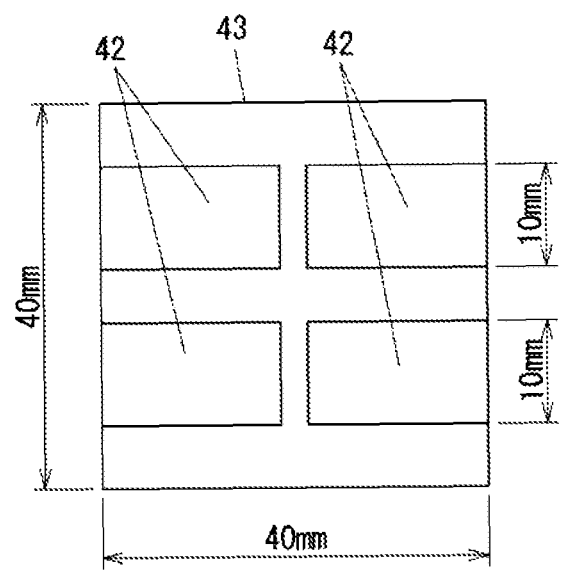
FIG. 4 shows a planar view of a mask which is used in the example; the mask is provided for forming the hole transport layer, the light emission layer, and the charge transport layer

The laminated body is set in the vacuum deposition apparatus, and hole transport layer 8 is formed on the electrode 1 with using the mask 43 having the opening 42 shown in FIG. 4. The deposition is performed under a condition of reduced pressure of $5 \times 10^{-5}$ Pa. The hole transport layer 8 is made of 4,4'-bis[N-(naphthyl)-N-phenyl-amino]biphenyl ([alpha]-NPD). The hole transport layer 8 has a thickness of 40 nm. Subsequently, the light emission layer 3 having the thickness of 30 nm made of Alq3 doped with 6 percent by mass of rubrene was prepared on the hole transport layer 8. Furthermore, the charge transport layer 9 which is made of TpPyPhB shown in the following chemical formula I and which has a thickness of 65 nm is formed.

CHEMICAL FORMULA 1

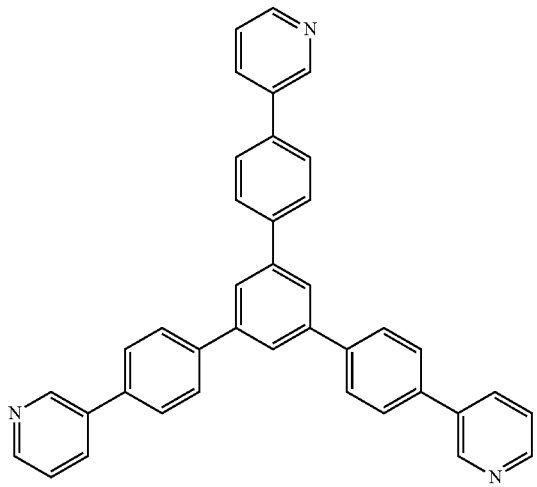

Figure 5:
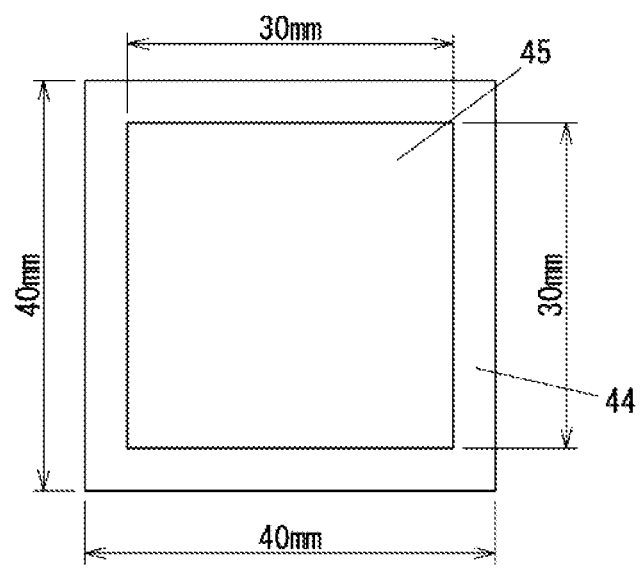
FIG. 5 shows a planar view of the mask which is used in the example; the mask is provided for forming the electron injection layer and the light reflective electrode.
Figure 6:
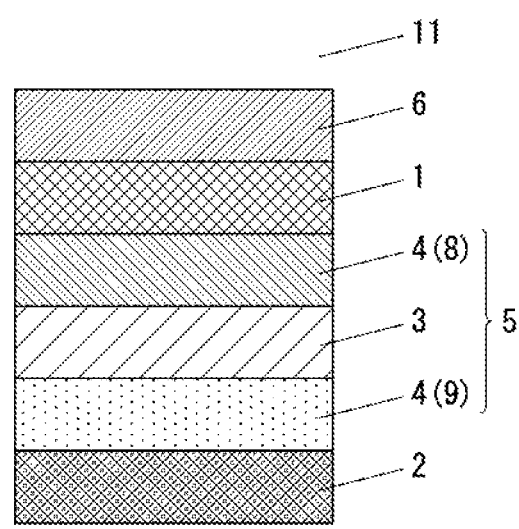
FIG. 6 shows a schematic side cross sectional view of one prior technique.
Figure 7:
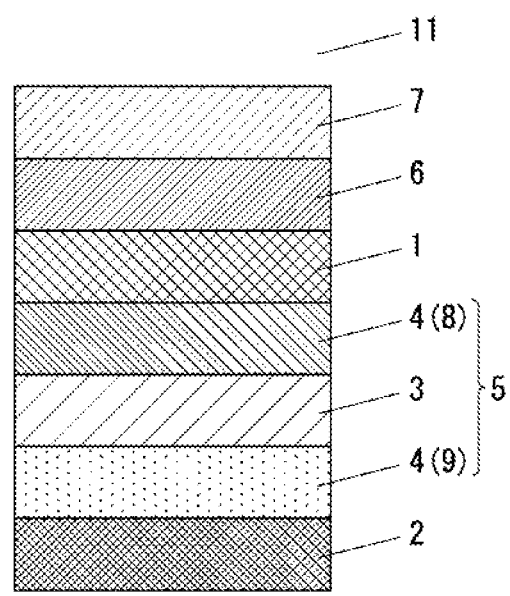
FIG. 7 shows a schematic side cross sectional view of another prior technique.

Then, the mask 43 was changed for the mask 44 which has a size shown in FIG. 5, and which has an opening 45. Then, the charge injection layer and the cathode is formed; the charge injection layer is made of LiF and has a thickness of 1 nm; the cathode acts as the light reflective electrode 2 and is made of Al to have a thickness of 80 nm. Consequently, the organic electroluminescence element is obtained.

Comparative Example 1

The organic electroluminescence element was prepared according to same condition of example 1, except for the thickness of the charge transport layer 9; the thickness of the charge transport layer is 155 nm.

Example 2

The organic electroluminescence element was prepared according to the same condition of the example 1, except for the thickness of the charge transport layer 9; the thickness of the charge transport layer 9 is 235 nm.

Example 3

The organic electroluminescence element was prepared according to the same condition of example 1, except for the thickness of the charge transport layer 9; the thickness of the charge transport layer 9 has a thickness of 350 nm.

Comparative Example 2

The organic electroluminescence element was prepared according to the same condition of the example 1, except for the thickness of the charge transport layer 9; the thickness of the charge transport layer 9 was 435 nm.

Example 4

The region 7, the electrode 1, the hole transport layer 8, the light emission layer 3 (in other words, first light emission layer 3) were formed in order and were formed on the substrate 6. Then, the charge transport layer 9 which is made of TpPyPhB and which has a thickness of 50 nm is formed. Then, as the charge supply layer 10, a certain layer and molybdenum oxide layer were formed. The certain layer is made of TmPyPhB doped with Li such that the mole ratio of TmPyPhB:Li is equal to 1:0.3. The certain layer has a thickness of 10 nm. The molybdenum oxide layer has a thickness of 10 nm. Subsequently, the hole transport layer 8, the second light emission layer 3, and the charge transport layer 9 were formed; the hole transport layer 8 is made of alpha-NPD and has a thickness of 110 nm; the second light emission layer 3 is made of TBADN shown in the following chemical formula 3 doped with TBP shown in the following chemical formula 4 to have a thickness of 30 nm; the charge transport layer 9 was made of TpPyPhB and had a thickness of 50 nm. Furthermore, the charge injection layer and the cathode were formed; the charge injection layer was made of LiF and had a thickness of 1 nm; the cathode was made of Al and had a thickness of 80 nm. Consequently, the organic electroluminescence element having two light emission layers 3 was prepared.

Chemical formula 2

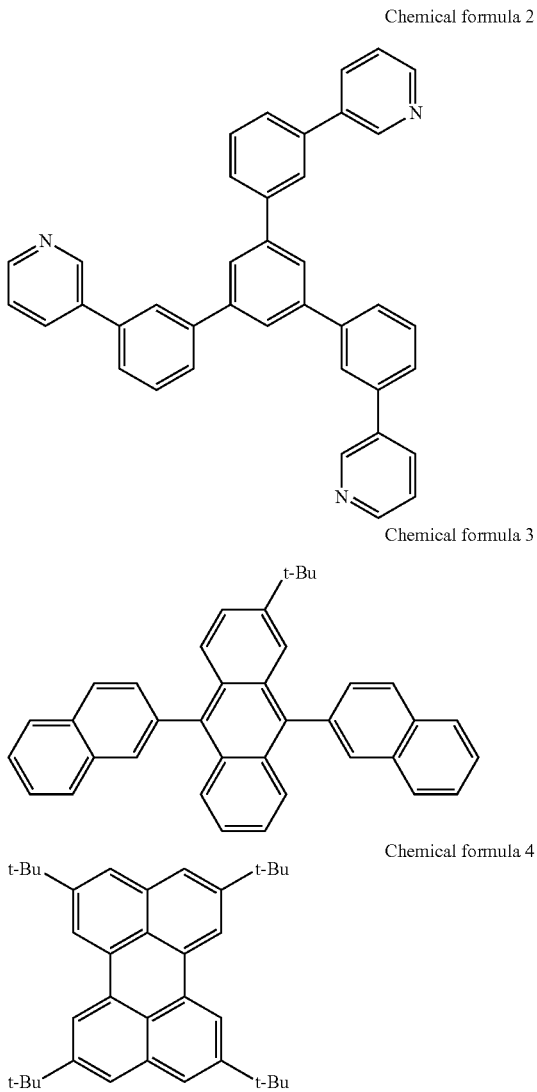

Chemical formula 3

Chemical formula 4

Comparative Example 3

The region 7, the electrode 1, the hole transport layer 8, the light emission layer 3, the charge transport layer 9, the charge supply layer 10, and the molybdenum oxide layer were formed on the substrate 6 in order, under the same condition of the example 4. Then, the hole transport layer 8 which was made of alpha-NPD and which had a thickness of 200 nm was formed. Subsequently, according to the same condition of the example 4, the second light emission layer 3 is formed, and subsequently the charge transport layer 9 made of TpPhPhB and having a thickness of 150 nm was formed. Furthermore, under the same condition of example 4, the charge injection layer and the cathode were formed, whereby the organic electroluminescence element having two light emission layers 3 was prepared.

Example 5

The organic electroluminescence element was prepared under the same condition of the example 1, except for the charge transport layer 9; the charge transport layer 9 was made of TmPyPhB and had a thickness of 70 nm.

Comparative Example 4

The organic electroluminescence element was prepared according to the same condition of the example 1, except for the charge transport layer 9; the charge transport layer 9 was made of TmPyPhB and had a thickness of 170 nm.

Example 6

The organic electroluminescence element was prepared according to the same condition of the example 1, except for the charge transport layer 9; the charge transport layer 9 was made of TmPyPhB and had a thickness of 230 nm.

Comparative Example 5

The organic electroluminescence element was prepared according to the same condition of the example 1, except for the charge transport layer 9; the charge transport layer 9 was made of TmPyPhB and had a thickness of 345 nm.

Example 7

The organic electroluminescence element was prepared according to the same condition of the example 1, except for the charge transport layer 9; the charge transport layer 9 was made of DPB and had a thickness of 85 nm.

Comparative Example 6

The organic electroluminescence element was prepared according to the same condition of the example 1, except for the charge transport layer 9; the charge transport layer 9 was made of DPB and had a thickness of 185 nm.

Example 8

The organic electroluminescence element was prepared according to the same condition of the example 1, except for the charge transport layer 9; the charge transport layer 9 was made of DPB and had a thickness of 275 nm.

Comparative Example 7

The organic electroluminescence element was prepared according to the same condition of the example 1, except for the charge transport layer 9; the charge transport layer 9 was made of DPB and had a thickness of 380 nm.

(The Photoluminescence Spectrum of the Luminescent Material of the Light Emission Layer 3)
(1) Rubrene The co-deposited film was prepared on the glass substrate; the co-deposited film comprises Alq3 as a host and rubrene as a light emission dopant; the Alq3 is doped with the rubrene of 6 percent by mass. According to the measurement of the photoluminescence spectrum, the photoluminescence spectrum has a maximum value when the wavelength is equal to 559 nm.

The product obtained by multiplying the spectral radiant flux and the CIE standard relative luminosity factor has a maximum value when the wavelength "$\lambda_1$ (lambda$_1$)" is 559 nm. The quotient obtained by dividing the spectral radiant flux and the photon energy in each the wavelength has a maximum value when the wavelength "$\lambda_2$ (lambda$_2$)" is 561 nm.

(2) TBP

The co-deposited film was prepared on the glass substrate; the co-deposited film comprises the host and the light emission dopant; the co-deposited film was a TBADN doped with 4 percent by mass of the TBP. Then, the photoluminescence spectrum was measured in the same fashion of rubrene. In this case, the photoluminescence spectrum has a maximum value when the wavelength "$\lambda_1$ (lambda$_1$)" was equal to 462 nm. The product obtained by multiplying the spectral radiant flux and CIE standard luminosity factor has a maximum value when the wavelength "$\lambda_1$ (lambda$_1$)" is equal to 504 nm. The quotient obtained by dividing the spectral radiant flux by the photon energy in each the wavelength has maximum value when the wavelength "$\lambda_2$ (lambda$_2$)" is equal to 464 nm.

(The Refractive Ratio, the Extinction Coefficient, and the Phase Shift of the Material)

With regard to the material of the organic electroluminescence element in each the example and comparative example the refractive index and the extinction coefficient of each the wavelengths "$\lambda_1$ (lambda$_1$)" and "$\lambda_2$ (lambda$_2$)" of rubrene and TBP are shown in the following table. The wavelengths "$\lambda_1$ (lambda$_1$)" and "$\lambda_2$ (lambda$_2$)" of the rubrene are shown in Table 1. The wavelengths "$\lambda_1$ (lambda$_1$)" and "$\lambda_2$ (lambda$_2$)" of the TBP are shown in Table 2.

It is noted that the following table shows the values of the refractive index "n" and the extinction coefficients "k" with regard to the TpPyPhB which is used as the charge transport material. On the other hand, with regard to the materials (alpha-NPD, Alq3, TBADN, and MoO$_3$) other than the TpPyPhB, the following table shows the values of the refractive index "n". In addition, Alq3 is doped with 6 percent by mass of rubrene as the dopant. TBADN is doped with 4 percent by mass of TBP as the dopant. However, these dopants have a little amount with respect to the Alq3 and the TBADN. Therefore, the optical property of each the layers are substituted by the optical property of the layers of single Alq3 and single TBADN. In addition, the refractive index of the layer employed as the charge supply layer comprising TpPhPyB doped with Li is considered to be equal to the refractive index of the layer of single TpPyPhB.

TABLE 1

| | lambda$_1$(589 nm) | | | lambda$_2$(561 nm) | | |
|---|---|---|---|---|---|---|
| | Refractive index | Extinction Coefficience | Phase shift | Refractive index | Extinction Coefficience | Phase shift |
| alpha-NPD | 1.81 | | | 1.81 | | |
| Alq3 | 1.73 | | | 1.73 | | |
| TBADN | 1.78 | | | 1.78 | | |
| MoO$_3$ | 2.13 | | | 2.13 | | |
| TpPyPhB | 1.94 | 0 | 2.58 | 1.94 | 0 | 2.56 |
| Al | 1.18 | 8.25 | | 1.18 | 6.25 | |
| TmPyPhB | 1.74 | 0 | 2.61 | 1.74 | 0 | 2.61 |
| DPB | 1.55 | 0 | 2.67 | 1.55 | 0 | 2.67 |

TABLE 2

| | lambda$_1$(504 nm) | | | lambda$_2$(464 nm) | | |
|---|---|---|---|---|---|---|
| | Refractive index | Extinction Coefficience | Phase shift | Refractive index | Extinction Coefficience | Phase shift |
| alpha-NPD | 1.82 | | | 1.86 | | |
| Alq3 | 1.75 | | | 1.80 | | |
| TBADN | 1.81 | | | 1.85 | | |
| MoO$_3$ | 2.16 | | | 2.21 | | |
| TpPyPhB | 1.97 | 0 | 2.48 | 2.01 | 0 | 2.41 |
| Al | 0.91 | 8.52 | | 0.74 | 5.12 | |

(Evaluation Test)

In the organic electroluminescence elements obtained by each the examples and the comparative examples, electrical current having the electrical current density of 10 mA/cm$^2$ is applied between the electrodes to generate the light, and the light was measured by the integrating sphere.

On the basis of the results, the current efficiency of the light flux (lm/A) is calculated; the current efficiency of the light flux is shown in the Table 3. In addition, Table 3 shows the optical distance "nd" between the luminous point and the light reflective electrode 2, the wavelength "$\lambda_1$ (lambda$_1$)", the phase shift $\phi$ in the wavelength "$\lambda_1$ (lambda$_1$)", the value a which is calculated on the basis of the formula (1) with the optical distance "nd" and the phase shift $\phi$, and the range of a which satisfies the formula (1) are also shown. In addition, the portion where the light emission layer 3 is in contact with the hole transport layer 8 is defined as the luminous point. Therefore, the optical distance "nd" is represented by the sum of the product obtained by multiplying the refractive index of the light emission layer 3 and the thickness of the light emission layer 3 and the product obtained by multiplying the refractive index of the charge transport layer 9 and the thickness of the charge transport layer 9.

TABLE 3

| | charge transport layer | | | | | | | range of "a" satisfying the formula (1) | Electrical current efficiency lm/A |
|---|---|---|---|---|---|---|---|---|---|
| | Material | Thickness (nm) | nd (nm) | lambda 1 (nm) | $\phi$ | m | a | | |
| Example 1 | TpPyPhB | 65 | 178.0 | 559 | 2.56 | 0 | 1.56 | 0.63 ≤ a ≤ 2.15 | 44.1 |
| Comparative example 1 | TpPyPhB | 155 | 352.6 | 559 | 2.56 | 0 | 3.10 | 0.63 ≤ a ≤ 2.15 | 14.1 |
| Example 2 | TpPyPhB | 235 | 507.8 | 559 | 2.56 | 1 | 1.29 | 1.06 ≤ a ≤ 1.97 | 27.7 |
| Example 3 | TpPyPhB | 350 | 730.9 | 559 | 2.56 | 1 | 1.86 | 1.06 ≤ a ≤ 1.97 | 29.3 |
| Comparative example 2 | TpPyPhB | 435 | 895.8 | 559 | 2.56 | 1 | 2.28 | 1.06 ≤ a ≤ 1.97 | 20.3 |
| Example 4  First layer | TpPyPhB | 50 | 541.5 | 559 | 2.56 | 1 | 1.38 | 1.06 ≤ a ≤ 1.98 | 69.5 |
|     second layer | TpPyPhB | 50 | 152.8 | 504 | 2.48 | 0 | 1.54 | 0.62 ≤ a ≤ 2.15 | |

TABLE 3-continued

| | | charge transport layer | | | | | | range of "a" | Electrical current |
| --- | --- | --- | --- | --- | --- | --- | --- | --- | --- |
| | | Material | Thickness (nm) | nd (nm) | lambda 1 (nm) | φ | m | a | satisfying the formula (1) | efficiency lm/A |
| Comparative example 3 | first layer | TpPyPhB | 50 | 898.4 | 559 | 2.56 | 1 | 2.28 | 1.06 ≤ a ≤ 1.98 | 34.4 |
| | second layer | TpPyPhB | 150 | 349.8 | 504 | 2.48 | 0 | 3.52 | 0.62 ≤ a ≤ 2.15 | |
| Example 5 | | TmPyPhB | 70 | 173.7 | 559 | 2.61 | 0 | 1.50 | 0.76 ≤ a ≤ 2.17 | 44.5 |
| Comparative example 4 | | TmPyPhB | 170 | 347.7 | 559 | 2.61 | 0 | 2.99 | 0.76 ≤ a ≤ 2.17 | 25.2 |
| Example 6 | | TmPyPhB | 230 | 452.1 | 559 | 2.61 | 1 | 1.14 | 1.03 ≤ a ≤ 1.64 | 28.8 |
| Comparative example 5 | | TmPyPhB | 345 | 652.2 | 559 | 2.61 | 1 | 1.65 | 1.03 ≤ a ≤ 1.64 | 24.6 |
| Example 7 | | DPB | 85 | 183.7 | 559 | 2.67 | 0 | 1.55 | 0.89 ≤ a ≤ 2.19 | 44.7 |
| Comparative example 6 | | DPB | 185 | 338.7 | 559 | 2.67 | 0 | 2.85 | 0.89 ≤ a ≤ 2.19 | 31.3 |
| Example 8 | | DPB | 275 | 478.2 | 559 | 2.67 | 1 | 1.20 | 1.00 ≤ a ≤ 1.32 | 37.5 |
| Comparative example 7 | | DPB | 380 | 640.9 | 559 | 2.67 | 1 | 1.61 | 1.00 ≤ a ≤ 1.32 | 32.8 |

In addition, the table 4 shows the result of the quantum efficiency of the light which is in proportion with the photon number, on the basis of the calculating result. In addition, Table 4 shows the optical distance "nd" between the luminous point and the light reflective electrode 2, the wavelength "$\lambda_1$ (lambda$_1$)", the phase shift φ in the wavelength "$\lambda_1$ (lambda$_1$)", the value a which is calculated on the basis of the formula (2) with the optical distance "nd" and the phase shift φ, and the range of a which satisfies the formula (2) are also shown. In addition, the portion where the light emission layer 3 is in contact with the hole transport layer 8 is defined as the luminous point. Therefore, the optical distance "nd" is represented by the sum of the product obtained by multiplying the refractive index of the light emission layer 3 and the thickness of the light emission layer 3 and the product obtained by multiplying the refractive index of the charge transport layer 9 and the thickness of the charge transport layer 9.

TABLE 4

| | | charge transport layer | | | | | | range of "a" | quantum |
| --- | --- | --- | --- | --- | --- | --- | --- | --- | --- |
| | | Material | thickness (nm) | nd (nm) | lambda 2 (nm) | φ | m | a | satisfying the formula (2) | efficiency (%) |
| Example 1 | | TpPyPhB | 65 | 178.0 | 561 | 2.56 | 0 | 1.56 | 0.63 ≤ a ≤ 2.15 | 6.9 |
| Comparative example 1 | | TpPyPhB | 155 | 352.6 | 561 | 2.56 | 0 | 3.01 | 0.63 ≤ a ≤ 2.15 | 2.2 |
| Example 2 | | TpPyPhB | 235 | 507.8 | 561 | 2.56 | 1 | 1.29 | 1.06 ≤ a ≤ 1.97 | 4.3 |
| Example 3 | | TpPyPhB | 350 | 730.9 | 561 | 2.56 | 1 | 1.85 | 1.06 ≤ a ≤ 1.97 | 4.5 |
| Comparative example 2 | | TpPyPhB | 435 | 895.8 | 561 | 2.56 | 1 | 2.27 | 1.06 ≤ a ≤ 1.97 | 3.2 |
| Example 4 | First layer | TpPyPhB | 50 | 541.5 | 561 | 2.56 | 1 | 1.37 | 1.06 ≤ a ≤ 1.95 | 10.8 |
| | second layer | TpPyPhB | 50 | 156.0 | 464 | 2.48 | 0 | 1.70 | 0.62 ≤ a ≤ 2.15 | |
| Comparative example 3 | first layer | TpPyPhB | 50 | 898.4 | 561 | 2.56 | 1 | 2.28 | 1.06 ≤ a ≤ 1.95 | 5.4 |
| | second layer | TpPyPhB | 150 | 357.0 | 464 | 2.48 | 0 | 3.90 | 0.62 ≤ a ≤ 2.15 | |
| Example 5 | | TmPyPhB | 70 | 173.7 | 561 | 2.61 | 0 | 1.50 | 0.76 ≤ a ≤ 2.17 | 6.9 |
| Comparative example 4 | | TmPyPhB | 170 | 347.7 | 561 | 2.61 | 0 | 2.99 | 0.76 ≤ a ≤ 2.17 | 3.9 |
| Example 6 | | TmPyPhB | 230 | 452.1 | 561 | 2.61 | 1 | 1.14 | 1.03 ≤ a ≤ 1.64 | 4.5 |
| Comparative example 5 | | TmPyPhB | 345 | 669.6 | 561 | 2.61 | 1 | 1.65 | 1.03 ≤ a ≤ 1.64 | 3.8 |
| Example 7 | | DPB | 85 | 183.7 | 561 | 2.67 | 0 | 1.55 | 0.89 ≤ a ≤ 2.19 | 6.9 |
| Comparative example 6 | | DPB | 185 | 338.7 | 561 | 2.67 | 0 | 2.85 | 0.89 ≤ a ≤ 2.19 | 4.9 |
| Example 8 | | DPB | 275 | 478.2 | 561 | 2.67 | 1 | 1.20 | 1.00 ≤ a ≤ 1.32 | 5.8 |
| Comparative example 7 | | DPB | 380 | 640.9 | 561 | 2.67 | 1 | 1.61 | 1.00 ≤ a ≤ 1.32 | 5.1 |

The invention claimed is:

1. An organic electroluminescence element comprising:

an organic light emission layer which comprises a light emission layer including a luminescent material, said organic light emission layer being provided with a first surface and a second surface which is opposite of said first surface, a light reflective electrode being disposed on said first surface, a light transmissive electrode being disposed on the second surface, a light scattering layer being disposed on the light transmissive electrode, a light transmissive substrate being disposed on said light scattering layer, a light reflective electrode being spaced from a luminous point of said light emission layer by a distance d, wherein the distance "d" is defined by following formula, $$nd = a \times \frac{\lambda}{4}\left\{2m + \frac{\phi}{\pi}\right\} \quad (1)$$

wherein $$\phi = \tan^{-1}\left\{\frac{2(n_1 k_2 - n_2 k_1)}{n_1^2 - n_2^2 + k_1^2 - k_2^2}\right\}$$

wherein

λ is defined by a wavelength of a predetermined light which is emitted from the light emission layer, n is a refractive index of a layer which is located between the luminous point and the light reflective electrode at the light having the wavelength λ, $n_1$ is a refractive index of a layer which is located between the luminous point of the light emission layer and the light reflective electrode and which is in contact with the light reflective electrode, at the light having the wavelength $\lambda$, $k_1$ is an extinction coefficient of the layer which is located between the luminous point of the light emission layer and the light reflective electrode and which is in contact with the light reflective electrode, at the light having the wavelength $\lambda$, $n_2$ is a refractive index of the light reflective electrode at the wavelength $\lambda$ of the light, $k_2$ is an extinction coefficient of the light reflective electrode at the light having the wavelength $\lambda$, wherein m is equal to 0 or 1, when m is equal to 0, "a" satisfies a following formula $$-1.17 \times n_{org}/n_{EML} + 1.94 \leq a \leq -0.16 \times n_{org}/n_{EML} + 2.33$$

wherein when m is equal to 1, "a" satisfies a following formula $$0.28 \times n_{org}/n_{EML} + 0.75 \leq a \leq 2.85 \times n_{org}/n_{EML} - 1.23$$

wherein $n_{org}$ is a refractive index of a layer which is in contact with the light emission layer and which is located on a same side of the light emission layer as the light reflective electrode at the light having the wavelength $\lambda$, $n_{EML}$ is a refractive index of the light emission layer at the light having the wavelength $\lambda$.

2. The organic electroluminescence element as set forth in claim 1, wherein the wavelength $\lambda$ is a wavelength of the light which satisfies a condition where a product obtained by multiplying a spectral radiant flux of a photoluminescence spectrum of the predetermined light and a CIE standard luminosity factor has maximum.

3. The organic electroluminescence element as set forth in claim 1, wherein the wavelength $\lambda$ is a wavelength of the light which satisfies a condition where a quotient obtained by dividing a spectral radiant flux of a photoluminescence spectrum of the predetermined light by a photon energy of each the wavelengths has maximum.

4. The organic electroluminescence element as set forth in claim 1, wherein
said organic light emission layer comprises two light emission layers,
the distance d between said first electrode and each one of said luminous point is defined by said "d".

5. The organic electroluminescence element as set forth in claim 2, wherein said organic light emission layer comprises two light emission layers,
the distance d between said first electrode and each one of said luminous point is defined by said "d".

6. The organic electroluminescence element as set forth in claim 3, wherein said organic light emission layer comprises two light emission layers,
the distance d between said first electrode and each one of said luminous point is defined by said "d".

* * * * *